(12) United States Patent
Sengupta et al.

(10) Patent No.: US 11,574,111 B1
(45) Date of Patent: Feb. 7, 2023

(54) ELECTRONIC DESIGN TRACING AND TAMPER DETECTION USING AUTOMATICALLY GENERATED LAYOUT PATTERNS

(71) Applicant: Cadence Design Systems, Inc., San Jose, CA (US)

(72) Inventors: Rwik Sengupta, Austin, TX (US); Jeffrey Nelson, Saratoga Springs, NY (US); Philippe Hurat, San Jose, CA (US); Jac Paul P. Condella, Campbell, CA (US)

(73) Assignee: Cadence Design Systems, Inc.

( * ) Notice: Subject to any disclaimer, the term of this patent is extended or adjusted under 35 U.S.C. 154(b) by 0 days.

(21) Appl. No.: 17/139,876

(22) Filed: Dec. 31, 2020

(51) Int. Cl.
*G06F 30/398* (2020.01)
*G06F 16/532* (2019.01)

(52) U.S. Cl.
CPC .......... *G06F 30/398* (2020.01); *G06F 16/532* (2019.01)

(58) Field of Classification Search
CPC ...... G06F 30/398; G06F 1/163; G06F 21/335; G06F 21/45; G06F 21/57; G06F 21/71; G06F 21/73; G06F 21/87; G06F 2119/18; G06F 3/00; G06F 30/367; G06F 2111/04; G06F 2111/08; G06F 2119/12; G06F 3/017; G06F 30/30; G06F 30/33; G06F 11/2273; G06F 3/011; G06F 3/013; G06F 3/014; G06F 30/39; G06F 16/2462; G06F 30/392; G06F 1/1694; G06F 17/18; G06F 2203/011; G06F 2203/0384; G06F 3/012; G06F 3/015; G06F 3/0304; G06F 16/24578; G06F 16/2465; G06F 16/248; G06F 16/28; G06F 16/9537; G06F 16/9554; G06F 21/602; G06F 21/64; G06F 2216/03; G06F 21/32; G06F 2221/2113; G06F 3/167; G06F 2117/10; G06F 30/31; G06F 30/327; G06F 30/373; G03F 1/36; G03F 1/84; G03F 1/70; G03F 7/70441; G03F 7/705; G03F 7/70625; H01L 2924/00; H01L 22/20; H01L 2924/0002
USPC .................................................. 716/110–117
See application file for complete search history.

(56) References Cited

U.S. PATENT DOCUMENTS

| | | | |
|---|---|---|---|
| 6,023,566 | A | 2/2000 | Belkhale et al. |
| 7,681,103 | B2 | 3/2010 | Devadas et al. |
| 7,757,083 | B2 | 7/2010 | Devadas et al. |
| 7,801,325 | B1 | 9/2010 | Hetzel et al. |
| 7,818,569 | B2 | 10/2010 | Devadas et al. |
| 7,840,803 | B2 | 11/2010 | Clarke et al. |
| 7,904,731 | B2 | 3/2011 | Devadas et al. |

(Continued)

OTHER PUBLICATIONS

Krishnaswamy, S., et al. "Signature-based SER Analysis and Design of Logic Circuits," Advanced Technology Group, Synopsis Inc. ,dated Dec. 22, 2008.

(Continued)

*Primary Examiner* — Binh C Tat
(74) *Attorney, Agent, or Firm* — Vista IP Law Group, LLP (57) ABSTRACT

Disclosed are method(s), system(s), and article(s) of manufacture for implementing an approach to facilitate traceability and tamper detection of electronic designs. This approach allows for tracing and tamper detection at any stage of design and manufacturing, such as during layout generation, post-design, post-mask, and post manufacturing of the electronic designs.

20 Claims, 7 Drawing Sheets

(56) References Cited

U.S. PATENT DOCUMENTS

| 8,386,801 | B2 |   | 2/2013 | Devadas et al. |
|---|---|---|---|---|
| 10,915,691 | B2 | * | 2/2021 | Baidya ..................... G03F 1/70 |
| 2018/0307791 | A1 | * | 10/2018 | Mousa ............... G06V 10/7515 |
| 2019/0325103 | A1 | * | 10/2019 | Baidya .................... G06F 30/39 |

OTHER PUBLICATIONS

Charbon, E., et al., "Watermarking Techniques for Electronic Circuit Design," dated 2003.

Edwards, N., et al., "Unique Signatures from Printed Circuit Board Design Patterns and Surface Mount Passives," 51st International Carnahan Conference on Security Technology, Madrid, Spain, ICCST—2017.

* cited by examiner

ELECTRONIC DESIGN TRACING AND TAMPER DETECTION USING AUTOMATICALLY GENERATED LAYOUT PATTERNS

CROSS-REFERENCE TO RELATED APPLICATIONS

The present application is related to co-pending U.S. application Ser. No. 17/139,872, filed on Dec. 31, 2020, entitled "AUTOMATICALLY GENERATED LAYOUT PATTERNS FOR ELECTRONIC DESIGN TRACING AND TAMPER DETECTION", which is hereby incorporated by reference in its entirety.

BACKGROUND

Modern electronics products may include any number of integrated circuits (ICs) that have a large number of electronic components, such as transistors, logic gates, diodes, wires, etc., that are fabricated by forming layers of different materials and of different geometric shapes on various regions of a silicon wafer. The process to create these products start with a design workflow to create an electronic design, where a circuit description is transformed into a geometric description called a layout. The process of converting specifications of an integrated circuit into a layout is called the physical design process.

After a layout has been completed (or "taped out"), a manufacturing process follows to turn that electronic design into a physical product. Often, a semiconductor fabrication process is used to implement a multi-step sequence of mask assembly, photolithographic, and chemical processing steps to create wafers made of semiconducting material, where the wafers are then processed to create the IC chips. The entire manufacturing process may be used to create packaged chips, which are then assembled into a finished electronic product.

One issue that is faced by modern companies is that this manufacturing process typically requires the involvement of multiple parties at different points along the manufacturing and distribution chain. For example, the electronic design of an IC chip developed by a first company may need to be passed from the original owners/creators of the design to at least one or more additional companies to create the masks, to manufacture the IC chip, and/or to perform distribution of the finished products.

The problem is that since the manufacturing process typically requires the electronic design to be shared between multiple distinct parties at multiple different geographic locations, this means that there is often the lack of clear visibility by the owner of the design into the full extent to which that design has been used, modified, manufactured, or distributed as a manufactured part. Therefore, there is the distinct possibility of the design being subjected to some type of misuse or tampering by one of the third parties.

By way of illustration, consider the circumstance where the owner of an IC chip design enters into a contract with a foundry to manufacture a certain number of the IC chips, but the foundry decides to manufacture extra copies of that design, and to then wrongfully sells the extra product on the market without permission of the design owner. As another example, consider if the owner of an IC chip design sends the design to a foundry located in a foreign country for manufacturing, but the foundry and/or foreign agents secretly inserts some malicious content into the chip before manufacturing. These are examples of circumstances where it would be highly desirable for the existence of technology that would allow the design owner to detect such misuse or tampering of the electronic designs.

Therefore, there is a need for an approach to implement a solution that facilitates detection of misuse or tampering of electronic designs.

SUMMARY

Disclosed are method(s), system(s), and article(s) of manufacture for implementing an approach to facilitate traceability and tamper detection of electronic designs. Embodiments of the invention allow for tracing and tamper detection at any stage of design and manufacturing, such as during layout generation, post-design, post-mask, and post manufacturing of the electronic designs.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments are described hereinafter with reference to the figures. It should be noted that the figures are not necessarily drawn to scale. It should also be noted that the figures are only intended to facilitate the description of the embodiments, and are not intended as an exhaustive description of the invention or as a limitation on the scope of the invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments," in various places throughout this specification are not necessarily referring to the same embodiment or embodiments.

Embodiments of the invention provides an approach to facilitate traceability and tamper detection of electronic designs, such as sensitive IPs (Intellectual Properties) and SoCs (System on Chips). This approach allows for tracing and tamper detection at any stage of design and manufacturing, such as post-design, post-mask, and post manufacturing of the electronic designs.

Figure 1:
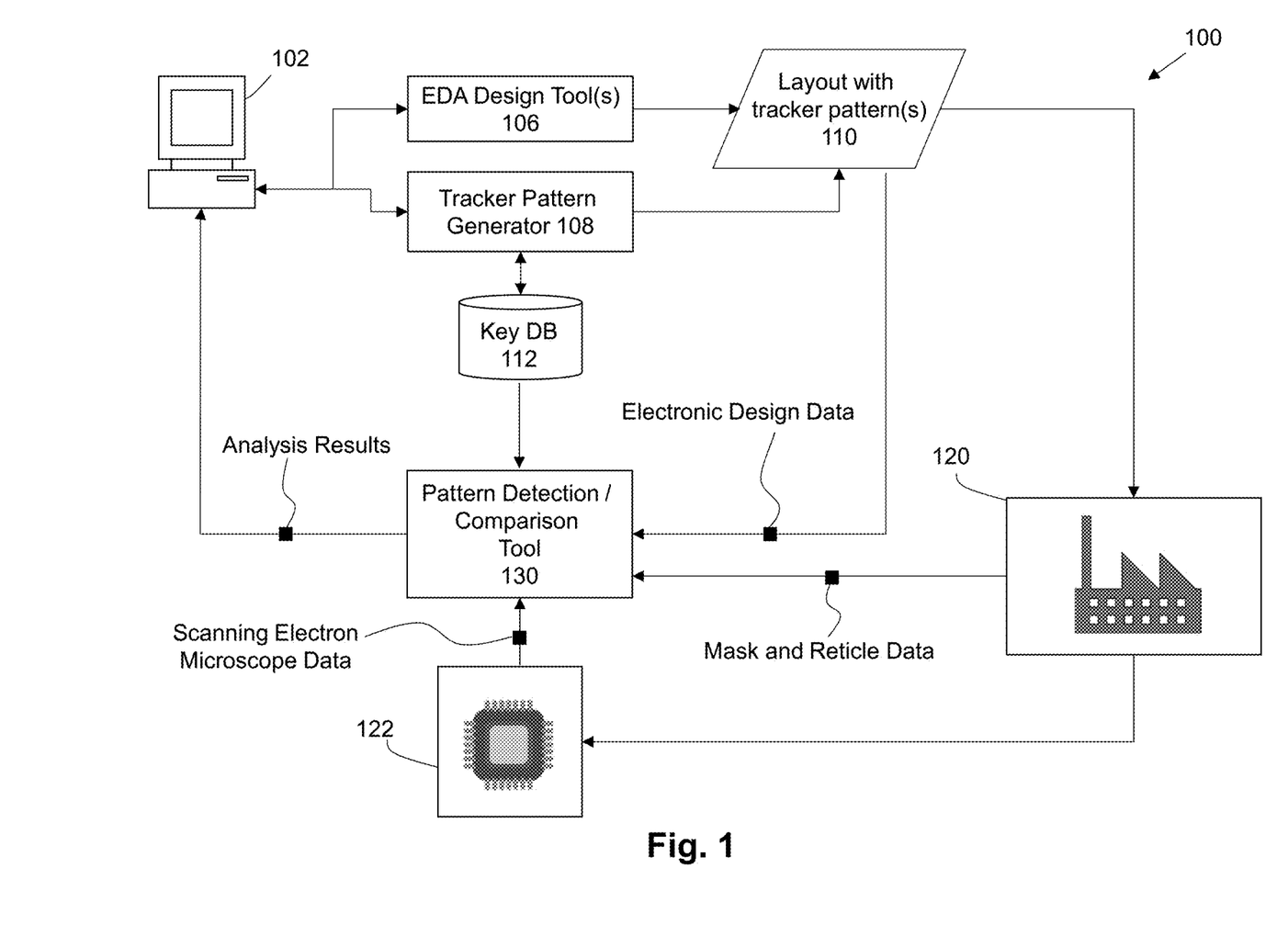
FIG. 1 illustrates an example system which may be employed in some embodiments of the invention.

FIG. 1 illustrates an example system 100 which may be employed in some embodiments of the invention. System 100 includes one or more users that interface with and operate a computing system to control and/or interact with system 100 using a computing station 102. Such users include, for example, electronic designers and engineers. The computing station 102 and any underlying computing device that facilitates any aspect of system 100 comprises any type of computing apparatus that may be used to operate, interface with, or implement one or more EDA systems/applications or pattern analysis tools. Examples of such computing systems include for example, servers, workstations, personal computers, or remote computing terminals connected to a networked or cloud-based computing platform. The computing system may comprise one or more input devices for the user to provide operational control over the activities of the system 100, such as a mouse or keyboard to manipulate a pointing object.

One or more design tools, such as electronic design automation (EDA) software tools 106, may be used to assist in the design process. Chip design using EDA software tools generally involves an iterative process whereby the chip design is gradually perfected. A top-down design methodology is commonly employed using hardware description languages (HDLs), such as Verilog or VHDL for example, by which the designer creates an integrated circuit by hierarchically defining functional components of the circuit, and then decomposing each component into smaller and smaller components. The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (e.g., given specific coordinate locations in the circuit layout) and "routed" (e.g., wired or connected together according to the designer's circuit definitions). In the area of custom designs, the user can directly and interactively conduct placement and routing in a manual approach, e.g., by manually manipulating the location of objects. In addition, after an initial placement/routing process that may have undergone either auto-placement or interactive placement, the layout may still undergo additional interactive changes to the existing placement of objects, by potentially inserting or moving objects in portions of the layout.

The system 100 includes a tracker pattern generator 108 that uses a key-based approach to generate tracking patterns for an electronic design. The tracking patterns are unique and deterministic layout patterns for components of the design. In particular, designated locations within the design would be identified, and those location are used in combination with a security key to generate a hash (which may be referred to as a pattern key) that can be used to generate a pattern having multiple shapes. A layout 110 is then generated which include the original layout plus the tracking patterns at the specified locations. The pattern keys are then stored within a key database 112.

The design layout 110 is used for manufacturing purposes. As described in more detail below, a manufacturing facility 120 (e.g., a foundry) would employ the design layout 110 to create a set of tooling and equipment (e.g., masks) to manufacture a product 122 based upon the electronic design.

At any point along the design and manufacturing stages, a pattern analysis tool 130 can be used to check for any misuse or tampering of the design. For example, during the design process, the layout 110 can be checked by the pattern analysis tool 130 to determine if there have been any changes made to the design. During the optical processing, printing, and/or manufacturing processes, manufacturing information (such as mask and reticle data) can be used by the pattern detection/comparison tool 130 to check for any tampering or changes that may have occurred to the design. After manufacturing, images of the physical circuitry on electronic products (e.g., generated using a scanning electron microscope) can be used by the pattern analysis tool to see if those products correspond to a given design.

Figure 2:
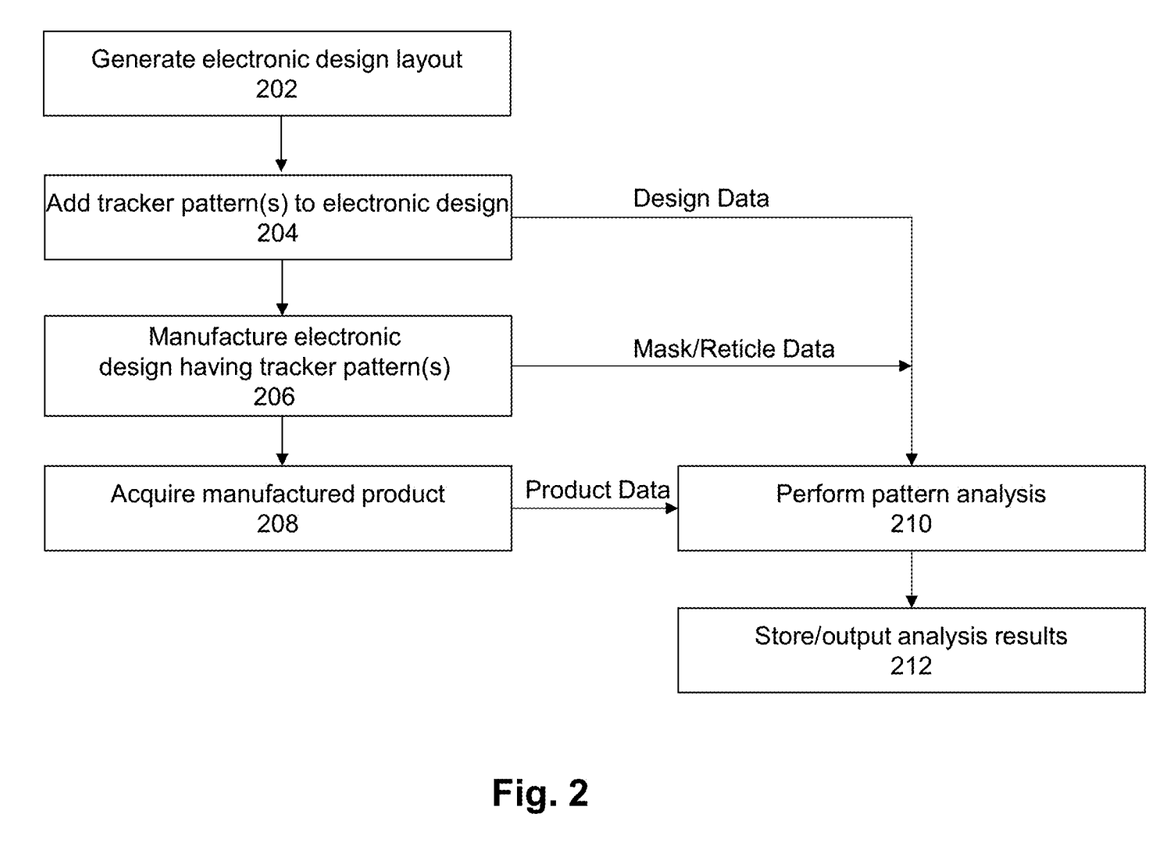
FIG. 2 shows a flowchart of an approach to implement some embodiments of the invention.

FIG. 2 shows a flowchart of an approach to implement some embodiments of the invention. At 202, a design layout is created for the electronic design. The layout will include, at designated locations within the layout, reserved placeholder areas for insertion of the tracking pattern. The reserved placeholder locations may be established during a floor-planning stage, where specific locations within the design will be set aside and reserved for the tracking pattern. These placeholder locations will in essence be empty boxes of a specified size that are reserved and cannot be used by the designer to insert any active intended functional design components for the electronic design (and which will be filled with a location-specific tracker pattern in a later stage of processing).

Figure 4:
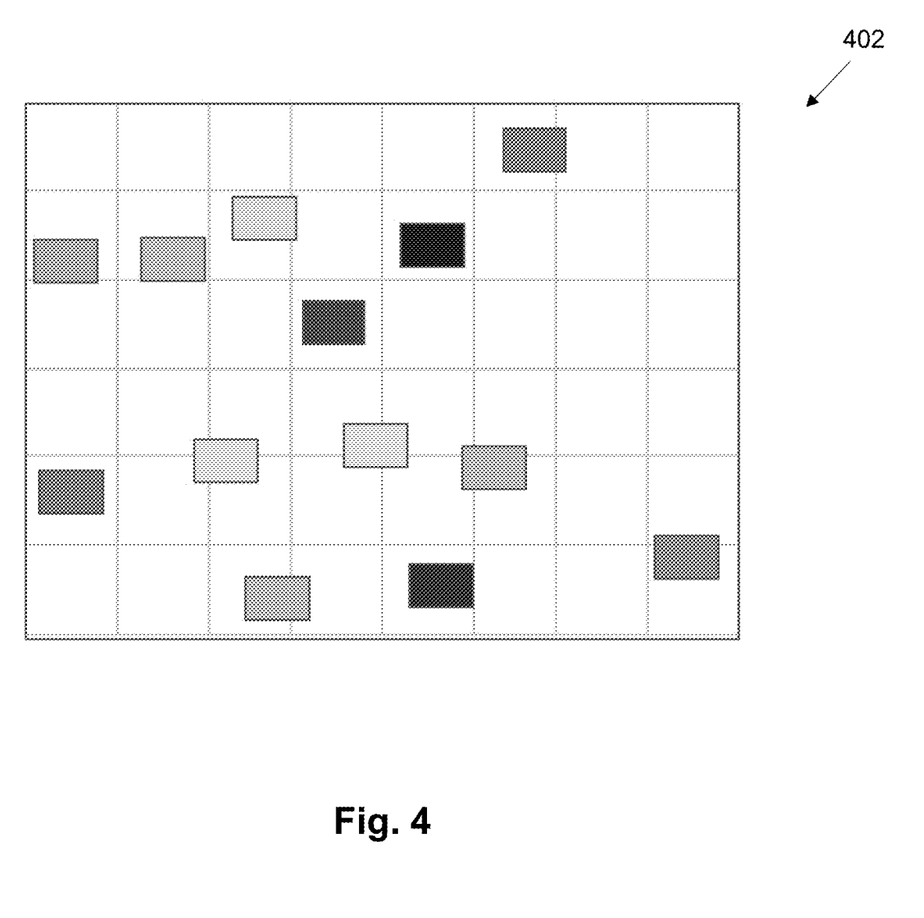
FIG. 4 illustrates a 2-dimensional approach to implement tracking patterns.
Figure 5:
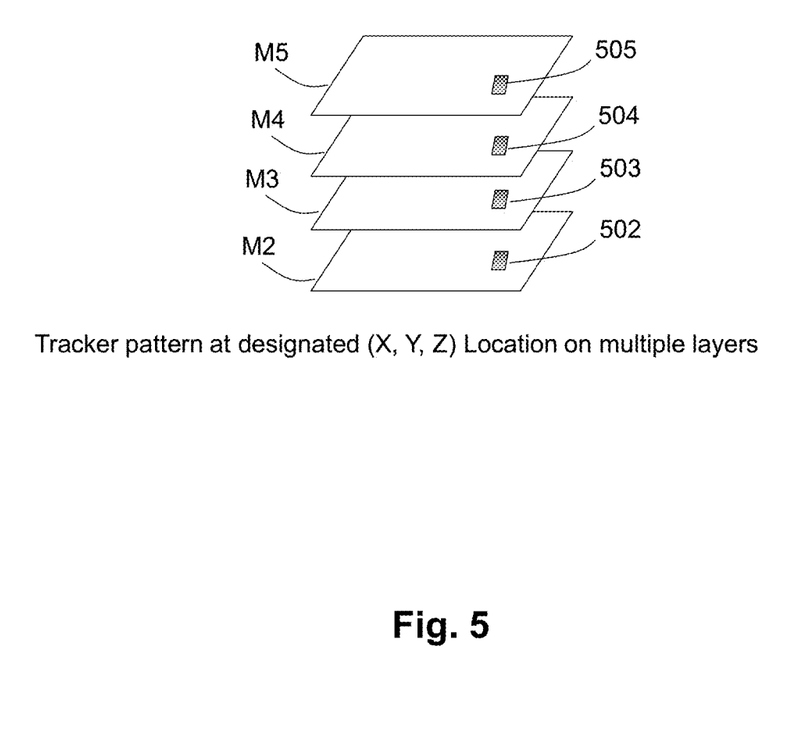
FIG. 5 illustrates a 3-dimensional approach to implement tracking patterns.

The reserved locations can be either 2-dimensional or 3-dimensional in nature. For the 2-dimensional embodiment, the reserved location(s) correspond to one or more (X,Y) locations on a single layer of the design where the tracking pattern can be later inserted, e.g., as shown in the illustrative diagram 402 of FIG. 4. For the 3-dimensional embodiment, the reserved location(s) correspond to one or more (X,Y,Z) locations pertaining to multiple layers of the design. For example, as shown in FIG. 5, multiple layers (e.g., metal layers M2, M3, M4, M5) of the electronic design may include reserved locations 502, 503, 504, and 505 on those metal layers for later insertion of the tracking patterns.

Any number of locations can be pre-reserved for the tracker patterns, with the number of location selected based upon any suitable criteria. One possible criteria pertains to the size of the electronic design, with larger designs having more reserved locations as compared to smaller designs, e.g., where every area of n square microns being required to reserve a respective placeholder for a tracker pattern. Another possible criteria may pertain to a given user's desire or requirement for greater or less levels of traceability, where the user desiring a greater level or certainty of traceability includes higher numbers of reserved locations for the tracker patterns, whereas a user that needs or can tolerate lower levels of confidence for traceability may include smaller numbers of reserved locations for the patterns.

In some embodiments, the tracker patterns each correspond to a fixed size or area. As such, each of the reserved placeholder locations for the tracker patterns would be of the same fixed size.

At step 204, the tracker patterns are added to each of the reserved locations within the layout of the electronic design. To generate the patterns, a secret key is employed for the design. The secret key may be embodied, for example, as a supplied secret alphanumeric key, e.g., a key that could be unique to each project, team or organization. As previously noted, each of the reserved locations are associated with a unique location (e.g., a unique (X, Y) on a specific layer or a unique (X, Y, Z) location on multiple layers). These unique location are used in combination with the secret key to generate a unique pattern hash/key for each of those locations, where the pattern hash/key can be used to deterministically generate a pattern. The pattern that is generated from the pattern hash/key comprises a composition, orientation, number and/or arrangement of shapes that is unique to a given location, and which may be deterministically generated (or re-generated) based upon the pattern hash/key.

It is noted that the inventive mechanism can take a particular process technology into consideration when generating the tracker pattern and/or pattern hash/key. One reason for this technology-dependent approach is because the inserted pattern should be able to pass any DRC (design rule check) verification of the layout, where the DRC rules may have differing requirements between different fabrication facilities and between different process node sizes and technologies. Therefore, it is possible that the same electronic design may result in different tracker patterns at the exact same X,Y location when the invention is applied to two different process technologies.

The tracker patterns may comprise floating fill patterns inserted into the reserved location. In some embodiments, the shapes within the tracker patterns may be connected to power or ground, e.g., to prevent detection by a malicious party that perform a connectivity trace analysis. This allows the tracker pattern to be indistinguishable from the intended design shapes on the rest of the design.

In some embodiments, the pattern key generation process can take into account the context of the pattern location. As such, the pattern generation process could consider, for example, the specific layer for which the pattern is to be inserted, the size of the device that includes the pattern, and any surrounding objects or shapes. Therefore, beyond just the location data, multiple items and types of data and metadata may be extracted from the design and used to generate the unique patterns.

At 206, the layout is used to manufacture an electronic product having the electronic design. As described in more detail below, multiple stages of manufacturing procedures may take place involving the electronic design to manufacture the electronic product.

Thereafter, at 208, one or more examples of a product suspected of including the electronic design may be acquired. At 210, pattern analysis may be performed upon the electronic product to determine if the product includes the tracking patterns at the recorded locations. Through this processing, it can be determined whether the electronic product includes the original electronic design. At 212, the analysis outputs can be stored and/or presented to the user.

Figure 3:
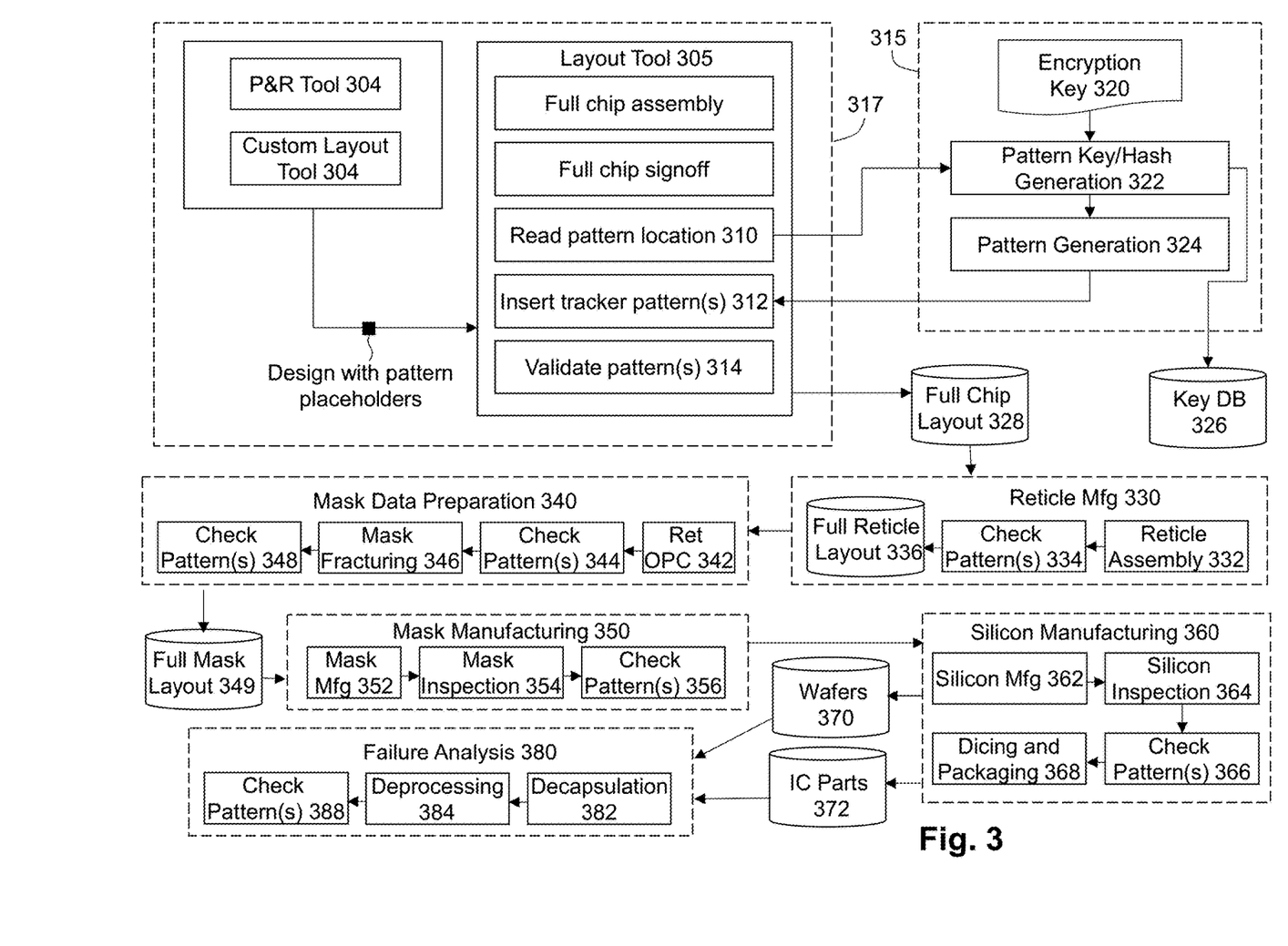
FIG. 3 shows a more detailed illustration of some embodiments of the invention.

FIG. 3 shows a more detailed illustration of some embodiments of the invention. Within the EDA tool portion 317, either a place and route tool 304 or a custom layout tool 304 may be used to create a design having placeholder location for the tracking patterns. The designers of confidential IP, blocks, and/or chips would reserve space for the tracking patterns using placeholder markers at regular intervals.

During the chip finishing stage, the tracker pattern generation tool 315 uses a secret key 320 to generate the tracker patterns. In some embodiments, the system generates an encoded set of unique keys, based on the user specified encryption key (which may also be referred to as the master key) and the set of target locations on the chip. At 310, the locations for the pattern placeholders in the design are read, and at 322, these locations are used in combination with the secret key 320 to generate a pattern hash/key for each of the locations. At 324, the patterns are generated using the pattern hash/key.

Every pattern hash/key is stored into a key database 326, along with the corresponding location for that pattern hash/key. It is noted that in some embodiments, the patterns themselves may be stored instead of, or in addition to, the pattern keys.

At 312, the system generates a set of DRC clean patterns for the manufacturing layers that are inserted on the target locations. At 314, the patterns are validated by the layout tool 305 (and/or using a separate verification tool). A signoff step can be used to validate the existence of the pattern placement marker on designated windows. Afterwards, the layout tool can produce the full chip layout 328 ready for manufacturing.

During reticle manufacturing 330, reticle assembly may occur at 332 based upon the full chip layout 328. Thereafter, at 334, a post-design verification stage may occur to check the patterns in the reticle against the patterns that were intended to be in the design. A comparison can be made to compare the tracker patterns generated from the key DB 326 to the patterns extracted from the reticle assembly stage, and any deviations can be identified and reported. A full reticle layout 336 can then be generated once the security review has been passed.

During mask data preparation 340, reticle OPC (optical proximity correction) 342 may be performed, optionally followed by another verification stage 344 to check the patterns against the tracker patterns from the key database 326. This may be followed by mask fracturing 346, which is once again optionally followed by yet another verification stage 348 to check the patterns against the tracker patterns from the key database 326. The result of these actions is the generation of as full mask layout 349.

Mask manufacturing 350 may then occur using the full mask layout 349. A mask manufacturing step 352 is performed, followed by mask inspection 354. A verification stage 356 can then be performed to check the mask patterns against the tracker patterns from the key database 326.

During silicon manufacturing 360, a silicon manufacturing step is performed at 362, followed by silicon inspection at 364. A verification stage 366 can be performed to check the patterns in silicon against the tracker patterns from the key database 326. Dicing and packaging is then performed at 368. The results of these manufacturing processes are the manufactured wafers 370 and IC parts 372.

Failure analysis can then be performed at 380. In particular, de-capsulation is performed at 382 followed by de-processing at 384 and pattern analysis at 388. With these actions, the inventive system can generate a post-silicon report using following flow: (a) take SEM (scanning electron microscope) images of x/y location, using information from Key DB; (b) compare extracted patterns with reference tracker patterns generated from Key DB; (c) produce a report that identifies deviations between post-mask DB and patterns generated from the Key DB. This report can be reviewed by a security team to detect if the chip was sold/used without authorization.

As is evident, this approach allows for pattern verification at every suitable stage along the sequence of actions that are used to design, manufacture, and distribute an electronic product. This permits examinations at any stage to determine whether there are any issues with the design. In addition this approach allows for adequate checks to ensure that sensitive designs contain the correct set of patterns at intervals (e.g., regular intervals) on the chip, IC, or SoC. There would be capability to re-create similar patterns from post-OPC mask database and post-silicon images. Additionally, the methodology could detect external tampering of the patterns, which could indicate unauthorized design modification, e.g., where the unauthorized modification is detected to change the patterns, the locations of the patterns, and/or removes some or all of the patterns.

Figure 6:
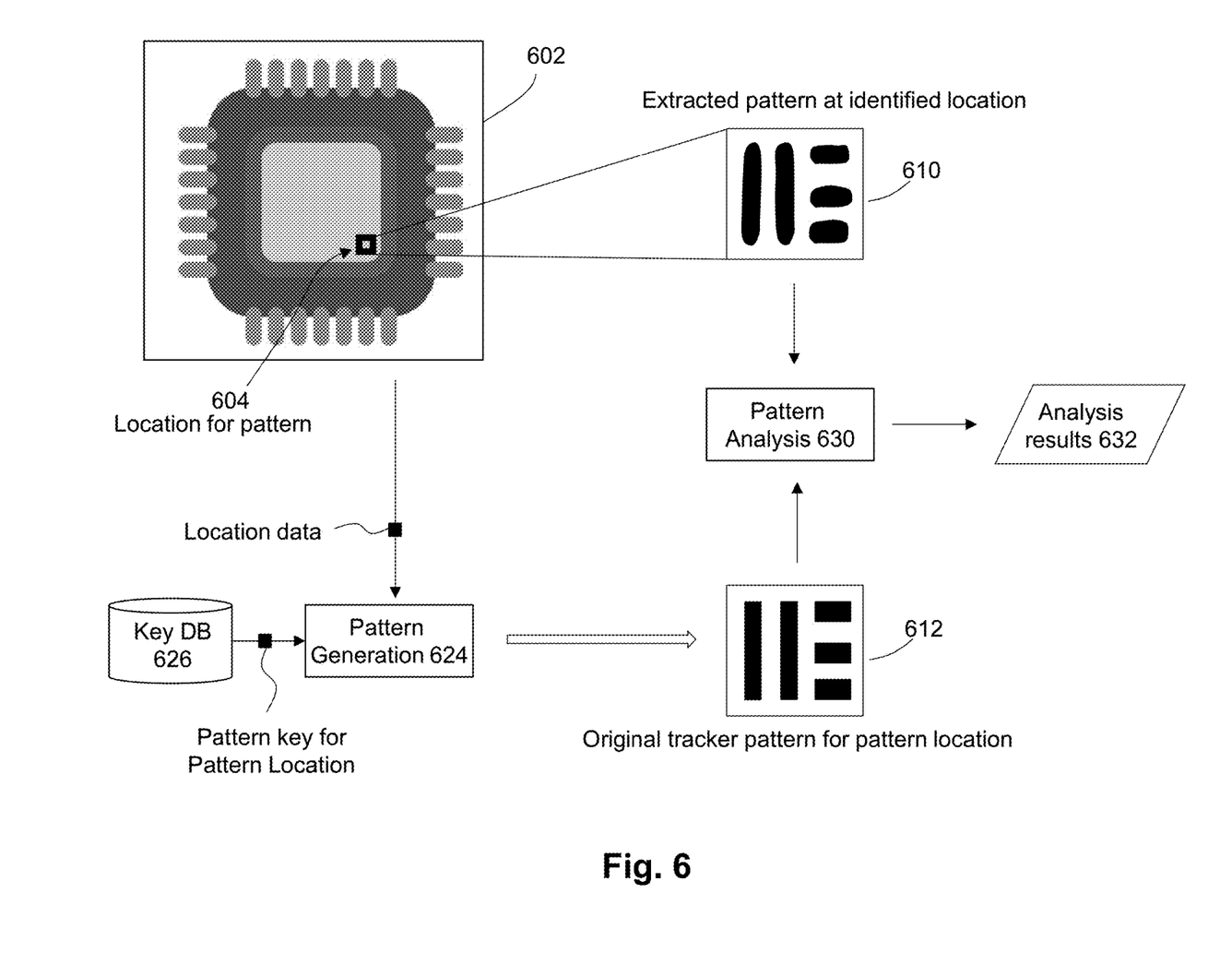
FIG. 6 illustrates an approach to implement pattern detection according to some embodiments of the invention.

FIG. 6 shows an illustration of an approach to perform pattern analysis and verification according to some embodiments of the invention. A manufactured electronic product 602 may be acquired, e.g., if there is a suspicion of that the electronic product 602 was produced by a factory as an unauthorized production batch based upon a misused or stolen design.

At one or more locations on the product, a check is made for the existence of certain patterns. For example, consider location 604 which is associated with a specific location on the product (the location could be one or more 2-dimensional (X,Y) locations and/or one or more 3-dimensional (X, Y, Z) locations). Extracted pattern 610 is an example of possible shapes that may be extracted from an identified location for a standard tracker pattern window size.

The location of interest is also used to identify the appropriate pattern hash/key from the key database 626. A pattern generation tool 624 is used to re-create the original tracker pattern 612 for that location that was on the full chip layout.

From this figure, it can be seen that the original tracker pattern 612 is not likely to be exactly the same as the extracted pattern 610. This is because the manufacturing, optical processing, and/or printing processing will introduce a certain amount of noise into the pattern, e.g., where square corners are rounded off during the manufacturing process, or where widths and/or lengths of the shapes change on the final product.

Various types of pattern analysis 630 may be performed to check the original tracker pattern 612 against the extracted pattern 610, with differing levels of cost and certainty associated with the different pattern analysis techniques. For example, a first order analysis may be performed very quickly and efficiently by reviewing only easily detectable characteristics of the shapes in the pattern such as for example: (a) the number of shapes; (b) length and width of shapes; (c) orientation of shapes; (d) spacing between shapes; and/or (e) correlative and relative placement of the shapes (e.g., based upon a via position connecting two metal layers). These types of characteristics can be checked against one or more thresholds for each parameter, and the combined results used as either by itself as a standalone "fast" test for whether the patterns match, or used as merely an initial filter in a sequence of pattern checks to determine whether and to what extent additional analysis should be performed.

Another possible approach is to employ area correlation between extracted pattern and the tracker pattern. This approach computes the total area covered by the shapes in the two patterns, and determines the delta between the two area values. If the two areas are different beyond a threshold level, then the analysis may conclude that the two patterns are different.

In addition, instead of working with the patterns on the basis of the individual shapes within the patterns, image-based analysis may be used to analyze the overall patterns as images. With this approach, image-based recognition algorithms may be employed to determine whether the two patterns correlate to each other.

A logical XOR operation may also be performed between the two patterns. With this approach, the shapes from one pattern are XORed against the shapes in the other pattern to determine any differences between the two. A threshold level can be configured, whereby if the difference is beyond the threshold level, then the analysis may conclude that the two patterns are different.

Regardless of the specific pattern analysis method that is used, the analysis results 632 are produced for the analysis that identifies whether there are any deviations between the product and the original design. The analysis results may be produced on a pattern-by-pattern basis for each of the tracker patterns that have been inserted into the design. Alternatively, the analysis may be based upon a combined result from evaluating some or all of the patterns in a comprehensive manner to determine whether the manufactured product matches the tracked electronic design. The report can be used, for example, security team to review and detect if the chip product was sold and/or used without authorization.

The above pattern analysis may be applied at any suitable stage of the design/manufacturing processing. For example, the noise introduced into the extracted pattern 610 may occur at various manufacturing stages such as the mask preparation stage, mask manufacturing stage, silicon manufacturing stage, and final product stage. Therefore, any of the pattern analysis techniques described above, e.g., for performing "fuzzy" analysis, may be applied at these stages to check for differences between the extracted pattern and the original pattern.

In addition, it is noted that the extracted patterns at earlier stages of design/manufacturing may not be subject to the type of manufacturing noise illustrated in pattern 610. Instead, earlier stages of the processing may correspond to extracted patterns that should be exactly or almost exactly the same as the original pattern. For example, at the pattern validation stage 314 or reticle pattern stage 334 of FIG. 3, the extracted patterns for analysis should align very closely with the original tracker patterns that were inserted into the layout. Therefore, these analysis stages may be performed to check for an exact match between the extracted pattern and the original tracker pattern. Some or all of the pattern analysis techniques described with respect to FIG. 6 may also be used in these earlier stages as well, where in some embodiments, the later processing stages with expected noise in the extracted patterns will use higher/looser threshold levels or tolerances for pattern analysis to detected pattern differences/similarities, whereas the earlier processing stages without expected noise in the extracted patterns will use smaller/tighter thresholds or tolerances for the pattern analysis.

Therefore, what was has been disclosed is an improved approach to facilitate traceability and tamper detection of electronic designs, where tracker patterns are inserted into an electronic design. The inventive mechanism can be driven by security administrators to enable traceability of sensitive IPs and SoCs at all stages of design and manufacturing. The patterns can be re-created and used to analyze post-OPC mask database and post-silicon images. In addition, wafers can be pulled out of the silicon manufacturing line and inspected for design integrity. Additionally, the approach can be used to detect external tampering of the product design, which could indicate unauthorized design modifications.

Figure 7:
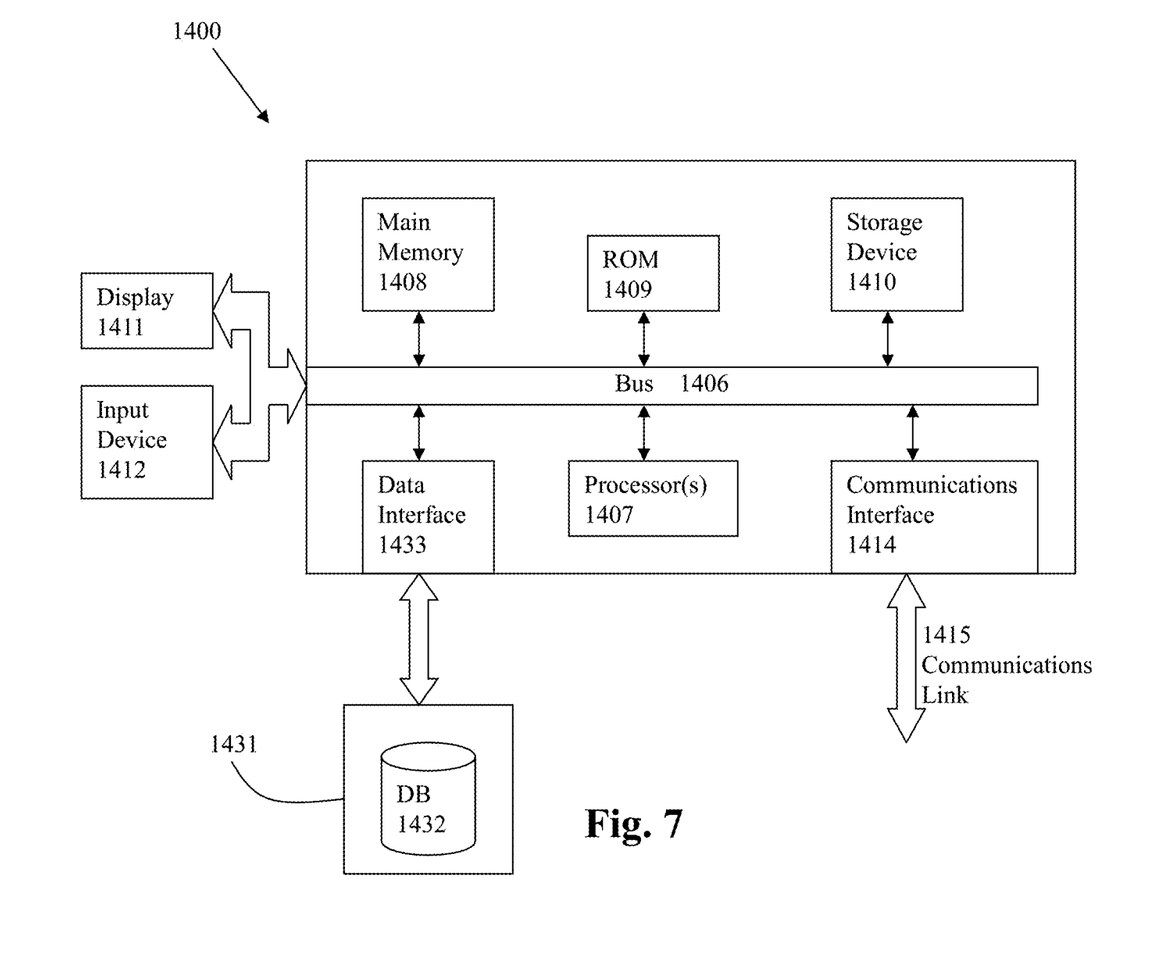
FIG. 7 is a block diagram of an illustrative computing system suitable for implementing an embodiment of the present invention.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), storage device 1410 (e.g., magnetic or optical), communication interface 1414 (e.g., modem or Ethernet card), display 1411 (e.g., CRT or LCD), input device 1412 (e.g., keyboard, and cursor control).

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or storage device 1410. In alternative embodiments, hardwired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in storage device 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method for implementing tracing or tamper detection, comprising:
   generating a location-specific pattern comprising a unique pattern associated with a location within an electronic design, wherein the location-specific pattern is added to a layout of the electronic design at the location;
   analyzing a manufactured electronic product to determine if the manufactured electronic product includes at least a portion of the electronic design based on at least a presence of the location-specific pattern by:
      extracting a pattern from a corresponding location on the manufactured electronic product;
      performing pattern matching between the pattern extracted from the manufactured electronic product and the location-specific pattern added to the layout of the electronic design; and
      generating an analysis result from performing the pattern matching indicating whether the manufactured electronic product includes the location-specific pattern indicating reproduction of the at least the portion of the electronic design.

2. The method of claim 1, wherein the location-specific pattern is generated by:
   identifying a pattern key for the location, wherein the pattern key is located in a key database; and
   using the pattern key in combination with the location to generate the location-specific pattern.

3. The method of claim 1, wherein the location comprises either a 2-dimensional location on a single layer or a 3-dimensional location on multiple layers of the electronic design.

4. The method of claim 1, wherein the pattern matching is performed by reviewing a shape characteristic of shapes in patterns including at least one of: (a) number of the shapes; (b) length and width of the shapes; (c) orientation of the shapes; (d) spacing between the shapes; or (e) correlation of relative placement of shapes.

5. The method of claim 4, wherein the pattern matching performed by reviewing the shape characteristic of shapes in the patterns comprises an initial filtering stage which is followed by one or more additional analysis stages.

6. The method of claim 4, wherein the pattern matching performed by correlation of relative placement of the shapes is performed by analyzing a via location connecting two metal layers.

7. The method of claim 1, wherein image recognition analysis is implemented to perform the pattern matching.

8. The method of claim 1, wherein an XOR operation is implemented to perform the pattern matching.

9. A computer program product embodied on a computer readable medium having stored thereon a sequence of instructions which, when executed causes a set of acts comprising:
   generating a location-specific pattern comprising a unique pattern associated with a location within an electronic design, wherein the location-specific pattern is added to a layout of the electronic design at the location;

analyzing a manufactured electronic product to determine if the manufactured electronic product includes at least a portion of the electronic design based on at least a presence of the location-specific pattern by:

extracting a pattern from a corresponding location on the manufactured electronic product;

performing pattern matching between the pattern extracted from the manufactured electronic product and the location-specific pattern added to the layout of the electronic design; and generating an analysis result from performing the pattern matching indicating whether the manufactured electronic product includes the location-specific pattern indicating reproduction of the at least the portion of the electronic design.

10. The computer program product of claim 9, wherein the location-specific pattern is generated by:

identifying a pattern key for the location, wherein the pattern key is located in a key database; and using the pattern key in combination with the location to generate the location-specific pattern.

11. The computer program product of claim 9, wherein the location comprises either a 2-dimensional location on a single layer or a 3-dimensional location on multiple layers of the electronic design.

12. The computer program product of claim 9, wherein the pattern matching is performed by reviewing a shape characteristic of shapes in patterns including at least one of: (a) number of the shapes; (b) length and width of the shapes; (c) orientation of the shapes; (d) spacing between the shapes; or (e) correlation of relative placement of shapes.

13. The computer program product of claim 12, wherein the pattern matching performed by reviewing the shape characteristic of shapes in the patterns comprises an initial filtering stage which is followed by one or more additional analysis stages.

14. The computer program product of claim 12, wherein the pattern matching performed by correlation of relative placement of the shapes is performed by analyzing a via location connecting two metal layers.

15. The computer program product of claim 9, wherein image recognition analysis is implemented to perform the pattern matching.

16. The computer program product of claim 9, wherein an XOR operation is implemented to perform the pattern matching.

17. A system for partitioning in a database system, comprising:

a processor; and a memory for storing a set of instructions, wherein the set of instructions are executable by the processor for:

generating a location-specific pattern comprising a unique pattern associated with a location within an electronic design, wherein the location-specific pattern is added to a layout of the electronic design at the location;

analyzing a manufactured electronic product to determine if the manufactured electronic product includes at least a portion of the electronic design based on at least a presence of the location-specific pattern by:

extracting a pattern from a corresponding location on the manufactured electronic product;

performing pattern matching between the pattern extracted from the manufactured electronic product and the location-specific pattern added to the layout of the electronic design; and generating an analysis result from performing the pattern matching indicating whether the manufactured electronic product includes the location-specific pattern indicating reproduction of the at least the portion of the electronic design.

18. The system of claim 17, wherein the location comprises either a 2-dimensional location on a single layer or a 3-dimensional location on multiple layers of the electronic design.

19. The system of claim 17, wherein the pattern matching is performed by reviewing a shape characteristic of shapes in patterns including at least one of: (a) number of the shapes; (b) length and width of the shapes; (c) orientation of the shapes; (d) spacing between the shapes; or (e) correlation of relative placement of shapes.

20. The system of claim 17, wherein an XOR operation is implemented to perform the pattern matching.

* * * * *